(12) United States Patent
Takashima

(10) Patent No.: US 7,064,972 B2
(45) Date of Patent: Jun. 20, 2006

(54) FERROELECTRIC MEMORY DEVICE AND READ CONTROL METHOD THEREOF

(75) Inventor: Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 591 days.

(21) Appl. No.: 10/403,120

(22) Filed: Apr. 1, 2003

(65) Prior Publication Data

US 2005/0270886 A1   Dec. 8, 2005

(30) Foreign Application Priority Data

Apr. 1, 2002   (JP)   ............................. 2002-099062

(51) Int. Cl.
*G11C 11/22*   (2006.01)
(52) U.S. Cl. ................. 365/145; 365/189.11
(58) Field of Classification Search ............... None
See application file for complete search history.

(56) References Cited

U.S. PATENT DOCUMENTS

| 5,903,492 A | 5/1999 | Takashima | ................. 365/145 |
| 6,977,835 B1* | 12/2005 | Kang | ......................... 365/145 |

OTHER PUBLICATIONS

D. Takashima, et al., ISSCC, IEEE International Solid-State Circuits Conference, Digest of Technical Papers, pp. 40-41, "A 76mm² 8Mb Chain Ferroelectric Memory", Feb. 5, 2001.
U.S. Appl. No. 10/934,358, filed Sep. 7, 2004, Oikawa et al.

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A ferroelectric memory device is disclosed, which includes a memory cell array which is formed of a matrix layout of memory cells each having a transistor with its gate connected to a word line and a ferroelectric capacitor having one end connected to a bit line and the other end connected to a plate line, a plate-line drive circuit for driving the plate line, a word-line drive circuit for driving the word line, and a sense amplifier connected to the bitline for detecting and amplifying memory cell data. At least one of the plateline drive circuit and said wordline drive circuit has a pullup circuit operable to potentially raise or boost an output terminal of this at least one circuit from a low level up to a high level and a pulldown circuit for letting the output terminal potentially drop from the high level down to the low level. At least one of the pullup and pulldown circuits is arranged to be variable in driving ability or "drivability" during its driving operation.

18 Claims, 7 Drawing Sheets

FERROELECTRIC MEMORY DEVICE AND READ CONTROL METHOD THEREOF

CROSS-REFERENCE TO RELATED APPLICATION

This application is based upon and claims the benefit of priority from the prior Japanese Patent Application No. 2002-099062, filed on Apr. 1, 2002, the entire contents of which are incorporated herein by reference.

BACKGROUND OF THE INVENTION

1. Field of the Invention

The present invention relates to ferroelectric memory devices which store data by use of ferroelectric capacitors in a nonvolatile way. This invention also relates to read control methodology for use with the nonvolatile ferroelectric memory devices.

2. Description of Related Art

Ferroelectric memory chips store binary data nonvolatilely in a way depending upon the magnitude of a remnant polarization of a ferroelectric capacitor. Prior known ferroelectric memories include memory cells, each of which is generally made up of a serial combination of one ferroelectric capacitor and one transistor in a similar manner to that in currently available dynamic random access memory (DRAM) chips. However, unlike DRAMs, ferroelectric memories are designed to store data in the form of the magnitude of a remnant polarization so that a need is felt to drive a plate line in order to read signal charge out of a memory cell onto a bit line associated therewith. Due to this, in prior art ferroelectric memories, plate-line drive circuitry requires the consumption of an increased chip area.

In contrast, an advanced ferroelectric memory cell array scheme capable of lessening the area of such plateline drive circuitry has been proposed by Takashima et al. This architecture is such that a memory cell, called unit cell, consists essentially of a parallel combination of one cell transistor (T) and one ferroelectric capacitor (C) with its both ends coupled to a source and a drain of the transistor. A plurality of such 1T/1C memory cells are connected in series into the form of a chain to provide a cell group, known as a cell block, as disclosed in D. Takashima et al., "High-Density Chain Ferroelectric Random Access Memory (CFRAM)," in Proc. VLSI Symp. June 1997, pp. 83–84. In ferroelectric memory chips of the type using such "TC-parallel cell-unit series-connected" configuration, a number—e.g. eight (8)—of unit cells are permitted to share a plateline drive circuit, thus enabling achievement of higher integration densities of on-chip cell arrays.

Practically the data of a ferroelectric memory is as follows. When a unit cell's ferroelectric capacitor is in a positive remnant polarization state, the data stored therein is a logic "1" (one); when in a negative remnant polarization state, a logic "0" (zero). The data readout principles in this case are as shown in FIGS. 12A and 12B. As apparent from viewing a hysteresis loop shown in FIG. 12A, a logic "1" data bit is read by applying a voltage to the ferroelectric capacitor in a presently selected cell from a plate line associated therewith. At this time the data is read destructively while accompanying a polarization reversal. After completion of the "1" data readout, the cell data temporarily becomes a logic "0." Thereafter, the ferroelectric capacitor is applied a reverse voltage in a way responsive to a read voltage obtainable on a bitline. This reverse voltage application causes the capacitor to again experience a polarization reversal, resulting in "1" data is restored or rewritten back thereinto. Reading of "0" data shown in FIG. 12B is nondestructive readout accompanied with no polarization reversal. In this event no voltage is applied to the ferroelectric capacitor even after the readout, resulting in "0" being rewritten without requiring any extra procedures.

SUMMARY OF THE INVENTION

A ferroelectric memory device in accordance with one aspect of this invention includes a memory cell array which is formed of a matrix layout of memory cells each having a transistor with its gate connected to a word line and a ferroelectric capacitor having one end connected to a bit line and the other end connected to a plate line, a plate-line drive circuit for driving the plate line, a word-line drive circuit for driving the word line, and a sense amplifier connected to the bit line for detecting and amplifying memory cell data. At least one of the plateline drive circuit and wordline drive circuit has a pull-up circuit for potentially raising or boosting an output terminal of this at least one circuit from a low level up to a high level and a pull-down circuit for letting the output terminal potentially drop from the high level down to the low level. At least one of the pullup circuit and pulldown circuit is arranged to be variable in driving ability or "drivability" during its driving operation.

A ferroelectric memory device in accordance with another aspect of the invention includes a memory cell array which is configured from a matrix layout of memory cells each having a transistor with its gate connected to a word line and a ferroelectric capacitor having one end connected to a plate line and the other end connected via the transistor to a bit line, a plate-line drive circuit for driving the plate line, a word-line drive circuit for driving the word line, a sense amplifier connected to the bitline for detecting and amplifying memory cell data. At least one of the plateline drive circuit and wordline drive circuit has a pullup PMOS transistor for potentially boosting an output terminal from a low level up to a high level, a pulldown NMOS transistor operable to force the output terminal to potentially drop from the high level down to the low level, and a delay element responsive to receipt of a timing signal for complementarily driving the gates of the pullup PMOS transistor and pulldown NMOS transistor while simultaneously letting these transistors vary in drivability.

In accordance with a further aspect of the invention, a method of controlling a read operation of a ferroelectric memory device which includes a cell block formed of a series connection or "chain" of multiple memory cells each having a transistor with its gate connected to a word line and a ferroelectric capacitor having one end connected to a bit line and the other end connected to a plate line, wherein each memory cell is such that both ends of the ferroelectric capacitor are connected to the source and drain of the transistor, and wherein the cell block has one end connected to the bit line through a block select transistor and the opposite end connected to the plate line. The read control method includes: a first step of causing each transistor of the memory cells to turn on resulting in these memory cells being set in a non-select state while letting the cell block be electrically disconnected from the bit line; a second step of driving, after the first step, the word line so that the transistor of a memory cell to be subjected to data readout in the memory cells turns off to thereby select this memory cell while simultaneously letting the bit line electrically float; and a third step of reading, after the second step, a signal voltage out of the selected memory cell onto the bit line by driving the plate line and also by turning the block select transistor on to thereby connect the cell block to the bit line. The third step includes causing the plate line to vary in drivability during its driving operation.

DETAILED DESCRIPTION OF THE INVENTION

Several illustrative embodiments of this invention will be explained with reference to the accompanying drawings below.

Figure 1:
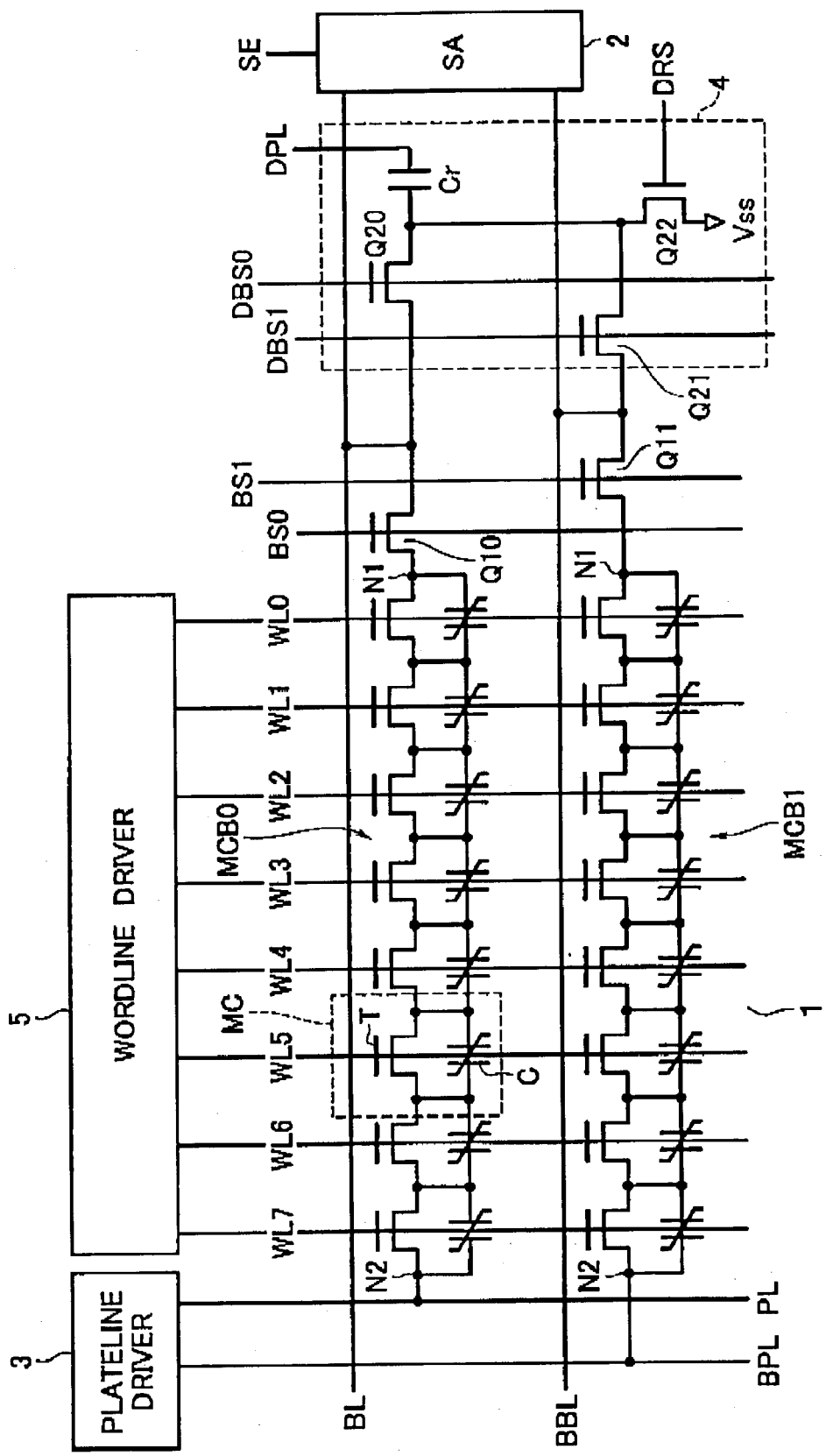
FIG. 1 is a diagram showing an equivalent circuit of a cell array of a ferroelectric memory in accordance with an embodiment of this invention.

Referring to FIG. 1, there is shown a configuration of a memory cell array 1 of a TC-parallel unit-cell series-connected ferroelectric memory chip embodying the invention. Unit cells MC are memory cells each of which is made up of a parallel connection of one cell transistor T and one ferroelectric capacitor C. More specifically a memory cell MC is arranged so that the source and drain of a cell transistor T are connected to both ends of a ferroelectric capacitor C associated therewith. In the example of FIG. 1, eight (8) unit cells MC with such TC parallel connected configuration are connected in series into a chain-like form to thereby constitute a cell block MCB. In FIG. 1, two neighboring cell blocks MCB0, MCB1 are shown for illustration purposes only, which are connected to a pair of bit lines BL, BBL.

The cell block MCB0 has its one terminate end N1 which is connected to a bit line BL through a block selecting transistor Q10 and the other end N2 connected to a plate line PL. Similarly the cell block MCB1 has its one end N1 connected via a block select transistor Q11 to a bit line BBL and its other end coupled to a plate line BPL. The plate lines PL, BPL are connected to a plate-line drive circuit 3. A chain of cell transistors in each cell block have their gates which are connected to parallel word lines WL (WL0 to WL7) respectively. These word lines WL0–WL7 in turn are connected to a word-line drive circuit 5. The paired bitlines BL, BBL are connected to a sense amplifier circuit (SA) 2, which is operable to detect and amplify read data.

The paired bitlines BL, BBL are also provided with a reference voltage generation circuit 4, which operates so that when one of the bitlines BL, BBL is selected, it applies a reference voltage to the other. In this example the reference voltage generator circuit 4 is arranged to employ a capacitor Cr having its one end to be driven by a drive line DPL. Capacitor Cr has its other end which is coupled to a source voltage Vss through a resetting N-channel metal oxide semiconductor (NMOS) transistor Q22 in a standby cycle and is selectively connected to one of the bitlines BBL, BL via an NMOS transistor Q20 or Q21 in an active cycle.

With such an arrangement, during data reading, for example when data is read onto one bitline BL, let the node of capacitor Cr be connected to the other bitline BBL. Then, capacitively couple thereto a voltage being given to the drive line DPL by capacitor Cr so that a reference voltage Vref is applied to bitline BBL. This reference voltage Vref is set at a specific potential level which is midway between the read voltages of data "0" and "1" to thereby enable data determination by the sense amplifier 2.

Incidentally it has been found by the inventor that prior art TC-parallel unit series-connected ferroelectric memory devices are faced with a problem that a transient voltage can be applied to the ferroelectric capacitor of a nonselected cell during data reading, which would result in degradation or "corruption" of its storage data. A detailed explanation is as follows. Prior art ferroelectric memory devices of this type are such that all the transistors within a cell block are held to turn on in a standby state resulting in both ends of any ferroelectric capacitor being electrically shortcircuited together by its associative transistor. And during data reading, set a selected word line at a low level causing the transistor of a selected cell within the cell block to turn off. This permits a read voltage to be applied from a plate line to the selected cell's ferroelectric capacitor through one or more turn-on transistors of a non-selected cell(s).

Figure 12A:
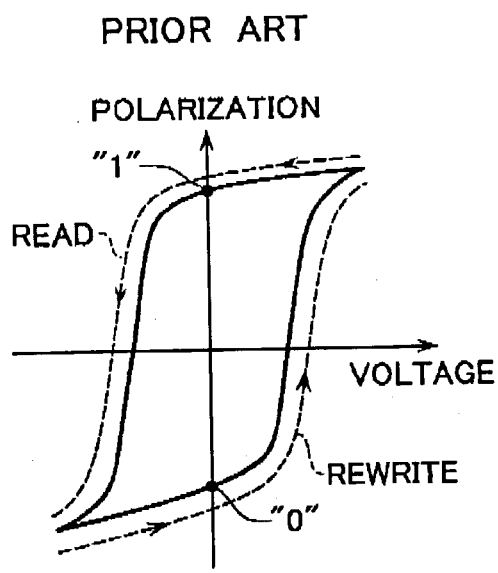
FIG. 12A is a characteristics diagram for explanation of the principle of a destructive reading operation of a ferroelectric memory.
Figure 12B:
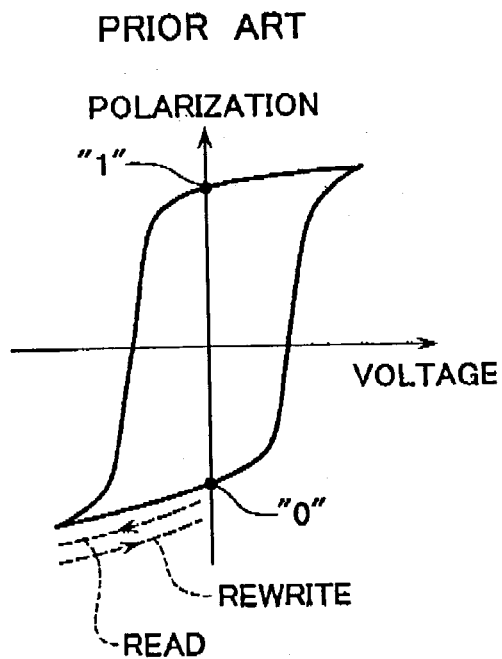
FIG. 12B is a characteristics diagram for explanation of the principle of a nondestructive read operation of the ferroelectric memory.
Figure 12C:
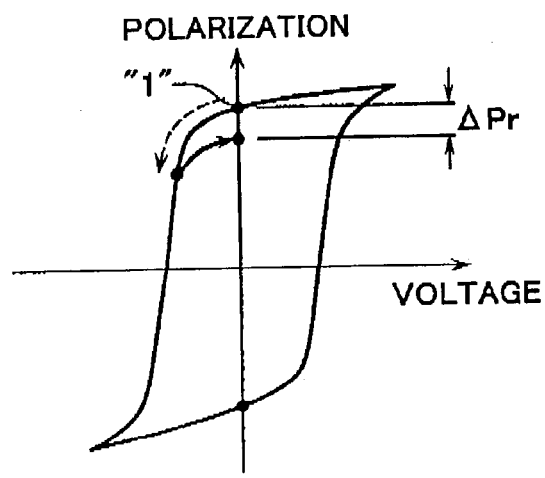
FIG. 12C is a characteristics diagram for explanation of the behavior of a ferroelectric capacitor in a non-selected memory cell storing therein logic "1" data.

In this case, since the turn-on resistance of such transistor as parallel-coupled to the ferroelectric capacitor is not zero in value, a transient voltage can be applied from the plate line to the ferroelectric capacitor at a nonselected cell within the selected cell block. Behavior of the ferroelectric capacitor in a nonselected cell storing logic "1" data at that time is shown in FIG. 12C. As shown herein, the transient voltage being applied to the ferroelectric capacitor of the nonselected "1" data cell is not so large in potential enough to cause "1" data to exhibit a polarization reversal. However, this capacitor does not completely recovers to its original polarization amount state upon termination of a read operation. Due to this, repeated execution of read operations results in a gradual increase in decrement amount ΔPr of the remnant polarization magnitude of such nonselected cell, which in turn leads to data reliability degradation—practically, unwanted decrease in read signal amount.

A similar problem also occurs during wordline driving. This can be said because when applying a potentially steep or precipitous drive voltage to a selected wordline, a transient voltage is applied to the ferroelectric capacitor of a nonselected cell through the capacitance component of a cell transistor being connected to this wordline.

In contrast, the ferroelectric memory in accordance with the embodiment of this invention shown in FIG. 1 is capable of suppressing the nonselected cell's data degradation by reducing a displacement or disturbance current flowing in the ferroelectric capacitor of such nonselected cell. This will be explained in detail below.

Figure 2:
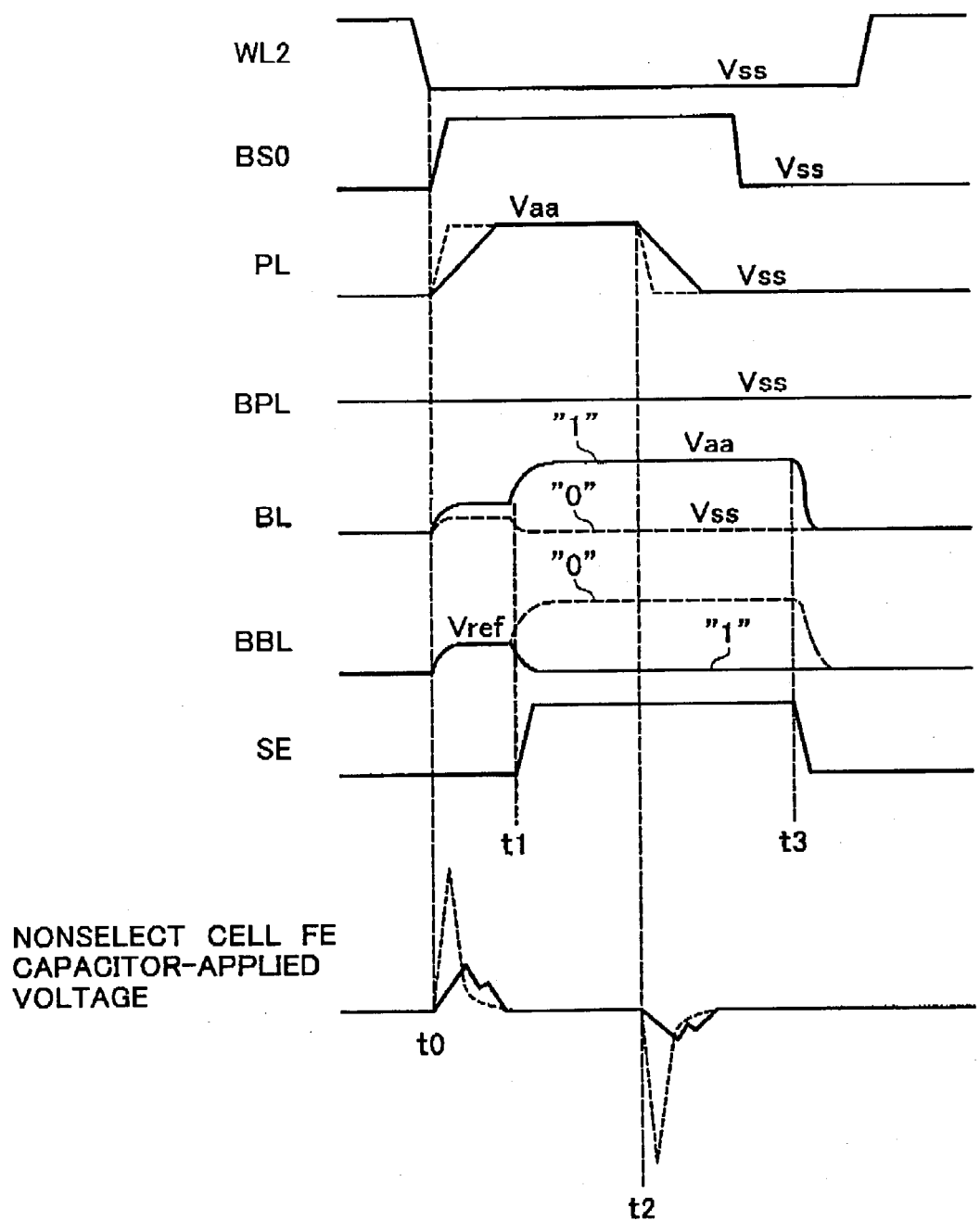
FIG. 2 is a diagram showing waveforms of some major signals occurring during operation of the ferroelectric memory shown in FIG. 1.

See FIG. 2, which is a timing diagram of a fundamental operation of such ferroelectric memory. Suppose that a unit cell MC stores therein a bit of binary data while regarding as a logic "1" the state that its ferroelectric capacitor retains a positive remnant polarization and letting the state that the capacitor has a negative remnant polarization as a logic "0." At the time of standby, all the word lines WL are set at "H" level while letting block select signals BS0, BS1 be set at "L" level with bit lines BL, BBL and plate lines PL, BPL held at low level Vss. Accordingly each unit cell MC is in the non-select state. At this time, the ferroelectric capacitor C of each cell is such that its both ends are electrically shorted together by an associated cell transistor T which presently turns on. Thus this capacitor retains data.

Upon entering an active operation, when a word line W2 for example is activated to select a unit cell on the bit-line BL side, let the bitline BL be electrically floating; then, at time t0, drive the wordline WL2 to set it at "L" level. Thereafter, set the block select signal BS0 at "H" and then drive the plate line PL so that this plateline potentially rises up to high level Vaa (positive voltage) from low level Vss (ground potential). Whereby, a voltage is applied to the ferroelectric capacitor C of a presently selected unit cell MC, resulting in a signal voltage being read out onto bitline DL in accordance with data "0" or "1."

The signal voltage as read to the bitline BL is detected by comparison with the reference voltage Vref being given to its paired bitline BBL. More specifically, potentially raise a sense-amp activation signal SE at time point t1 of FIG. 2 whereby bitline BL becomes at Vaa when the data is a logic "1" or alternatively at Vss when the data is a logic "0," owing to the sense amplifier 2. Thereafter at time t2, let the plateline PL return to Vss, thereby causing resultant read data to be rewritten or "reprogrammed" based on the read data of sense amplifier 2. Subsequently after forcing the block select transistor to turn off, make the sense amp 2 inactive at time 3, causing the selected wordline WL2 to potentially return at Vaa.

In this read/rewrite operation, if the storage data of interest is a logic "1," destructive readout is established; if a logic "0" then nondestructive read is done. More specifically as shown in FIG. 12A, in the case of logic "1" data, application of the positive voltage Vaa from plateline PL causes the ferroelectric capacitor to significantly decrease in remnant polarization, resulting in creation of a polarization reversal. And after completion of reading, reduce the voltage of plateline PL to Vss. This permits a reverse voltage to that during reading to be applied to the ferroelectric capacitor because the bitline is presently at the high voltage Vaa due to the read voltage. By the reverse voltage application, rewriting is again performed so that the capacitor is in the "1" data state with a positive remnant polarization. In the case of "0" data shown in FIG. 12B, no such polarization reversal due to the plateline voltage takes place. Additionally the reverse voltage is no longer applied after reading. Thus the cell capacitor is rewritten into its original state with a negative remnant polarization.

FIG. 2 shows the way how a transient voltage such as indicated by broken line is applied, during the read operation stated above, to the nonselected cell's ferroelectric capacitor at an edge of the steeply sloped or sharply ramped waveform of a drive voltage being given to the plateline PL. As previously stated, this occurs because the nonselected cell's transistor T turns on but its turn-on resistance is not zero in value. Such transient voltage application would cause a large disturbance current to rushes to flow in the ferroelectric capacitor in a moment. This causes data degradation stated supra.

To avoid the unwanted current flow, this embodiment is specifically arranged to change or vary the plateline PL in current driving ability or "drivability" at an appropriate time during its driving operation whereby the plateline PL's drive voltage waveform is made more moderate—that is, gently sloped or slowly ramped—at its rising and falling edges as indicated by solid lines in FIG. 2 so that the transient voltage to be applied to the nonselected cell's ferroelectric capacitor is made smaller in potential peaks.

Although not specifically depicted in FIG. 2, similar transient voltages can also be applied to the ferroelectric capacitor of a nonselected cell at edges of the drive voltage of a wordline WL. Accordingly, it is preferable that the wordline drive voltage be similarly moderated at its rising and fall waveform edges by varying its drivability an appropriate time point while during driving of the wordline WL to thereby lessen the potential peak of a transient voltage being applied to the nonselected cell's ferroelectric capacitor.

Figure 3:
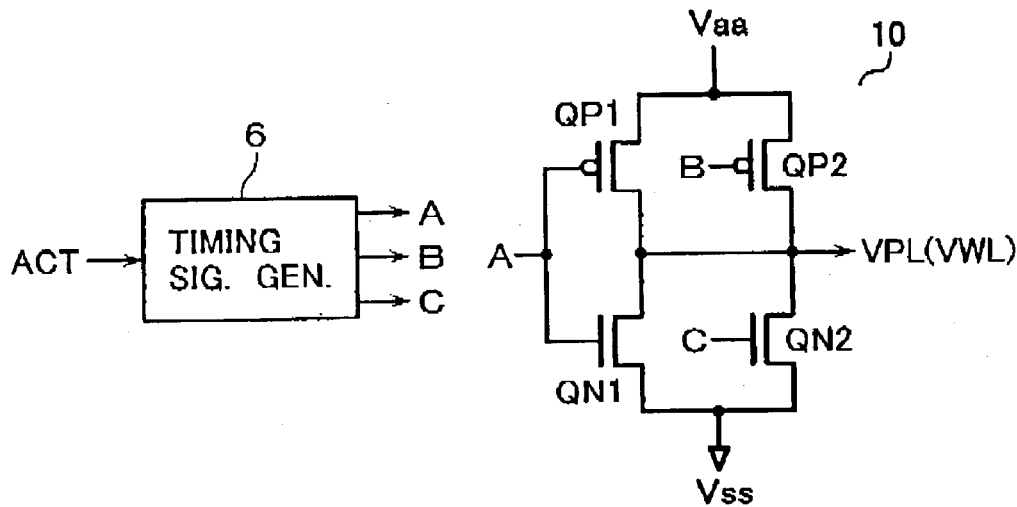
FIG. 3 is a diagram showing a configuration of core part of a drive circuit and a timing circuit operatively associated therewith in accordance with an embodiment of the invention, wherein the core drive circuit includes a plate-line drive circuit and a word-line drive circuit.

FIG. 3 shows a configuration of circuitry preferably adapted to suppress such transient voltages being applied to nonselected cells. This circuitry includes a drive circuit core unit 10 for use in the plateline drive circuit 3 and wordline drive circuit 5 along with a timing signal generator circuit 6 for timing control of the core drive circuit 10. This core circuit 10 has a couple of pull-up P-channel metal oxide semiconductor (PMOS) transistors QP1, QP2. These transistors QP1–QP2 are provided in parallel between an output terminal for output of a plateline drive voltage VPL (or alternatively wordline drive voltage VWL) and a circuit node to which the high level power supply voltage Vaa is applied. The output terminal will be simply referred to as "VPL terminal" hereinafter. The core drive circuit 10 also has two pull-down NMOS transistors QN1–QN2, which are parallel-provided between the VPL terminal and a circuit node to which the low level power supply voltage Vss is given.

The two pull-up PMOS transistors QP1–QP2 used to constitute a pullup circuit for charge up of the VPL terminal are different in current drivability from each other. A practically implementable approach to achieving different drivabilities is to design these transistors to have carefully chosen channel width versus channel length ratios. An example is that the channel width to channel length ratio of pullup PMOS transistor QP1 is less than that of pulldown PMOS transistor QP2, as represented by:

$$Wp1/Lp1 < Wp2/Lp2,$$

where Wp1 is the channel width of PMOS transistor QP1, Wp2 is the channel width of PMOS transistor QP2, Lp1 is the channel length of transistor QP1, and Lp2 is the channel length of QP2.

Likewise, the two NMOS transistors QN1–QN2 making up a pulldown circuit for discharging the VPL terminal are different in drivability from each other. A practical approach to achieving this is to design these transistors to have carefully chosen channel width to channel length ratios which follow. The channel-width/channel-length ratio of NMOS transistor QN1 is less than that of NMOS transistor QN2, as given by:

$$Wn1/Ln1 < Wn2/Ln2,$$

where Wn1 is the channel width of NMOS transistor QN1, Wn2 is that of NMOS transistor QN2, Ln1 is the channel length of transistor QN1, and Ln2 is that of QN2, The drivability-lessened PMOS transistor QP1 and NMOS transistor QN1 have their gates commonly coupled together at a nods, to which a timing signal "A" as generated by the timing circuit 6 is supplied. The remaining PHOS transistor QP2 and NMOS transistor QN2 have gates which are independent of each other. Supplied to these gates are different timing signals B, C from timing circuit 6, respectively.

Figure 4:
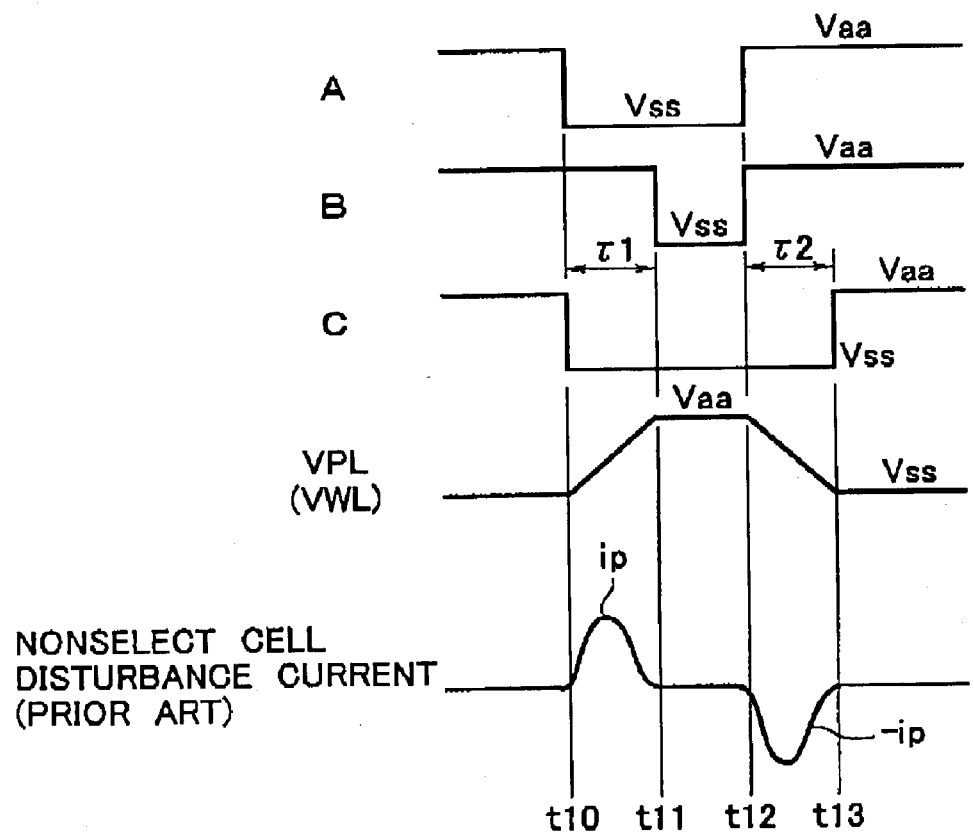
FIG. 4 is a diagram showing waveforms of major voltage signals during operation of the drive circuit of FIG. 3.

Turning to FIG. 4, waveforms of some major voltage signals available during operation of the core drive circuit 10 of FIG. 3 are shown with respect to the case where a positive voltage waveform is output to the VPL terminal. When the timing signals A, B, C are all at high potential level, the PMOS transistors QP1–QP2 turn off, whereas NMOS transistors QN1–QN2 turn on. Thus the VPL terminal stays at low level Vss. When the timing signals A and C potentially drop down to low level at time t10, both of the NMOS transistors QN1–QN2 turn off, and PMOS transistor QP1 turns on. As PMOS transistors QP1 is less in drivability, the VPL terminal potentially rises up with a gently sloped ascent (chargeup) curve.

The timing signal generator circuit 6 operates causing the timing signal B to be set at low level at time t11 with a delay σ1 of prespecified length of time duration. Whereby, the large-drivability PMOS transistor QP2 turns on, forcing the VPL terminal to reach a sufficiently high level Vaa. Regarding the fall-down of an output voltage waveform, let the timing signals A and B become at high level simultaneously at time t12, causing PMOS transistors QP1–QP2 to turn off together. Simultaneously drive one of NMOS transistors QN1–QN2—that is, small-drivability NMOS transistor QN1—to turn on. Thus VPL terminal potentially rises up with a gently sloped fall-down (discharge) curve. With a certain time delay σ2 after this potential falldown, the timing signal C becomes at high level at time t13. At this time, large-drivability NMOS transistor QN2 also turns on causing VPL terminal to return at the sufficiently low level Vss.

In this way, this embodiment is specifically arranged so that the VPL terminal's voltage waveform is made moderate in riseup and falldown ramps by switching the drivabilities of the pullup circuit and pulldown circuit from the low drivability state to high drivability state in a two-step way. Consequently as shown by solid lines in FIG. 2, it becomes possible to force the plateline PL driving voltage to more slowly rise up and fall down with moderate or gently sloped ramp curves. This in turn makes it possible to suppress or minimize any possible transient voltages being applied to the ferroelectric capacitors of nonselected unit cells.

In FIG. 4, displacement or disturbance currents ip, -ip flowing in the ferroelectric capacitor of a nonselected cell in memory chips using prior art drive schemes, along with an output voltage waveform of the VPL terminal. These currents are disturbance current components flowable in nonselected cell's ferroelectric capacitor in the event that the timing signal B becomes at low level at time t10 simultaneously when the timing signals A and C potentially goes low and that the timing signal C goes high in potential at time t12 simultaneously when timing signals A–B potentially goes high: in other words, in case an "ideal" step-like voltage is given to the VPL terminal—i.e. in the so-called step-response event. This disturbance current flow can cause degradation of "1" data.

In this embodiment, it becomes possible to suppress any useless disturbance currents by letting the VPL voltage waveform be more moderate within a time period in which the above-noted disturbance currents ip, -ip can flow. Preferably, set a transient time σ1 as taken for the VPL voltage waveform to change from the low level up to high level and a transient time σ2 taken to reach low level from high level so that these are greater than or equal in length to the duration in which the disturbance currents ip, -ip flow in the "step response" event stated previously. With such an arrangement, it is possible to suppress the flow of disturbance currents, which in turn makes it possible to preclude data degradation of nonselected unit cells.

Figure 5:
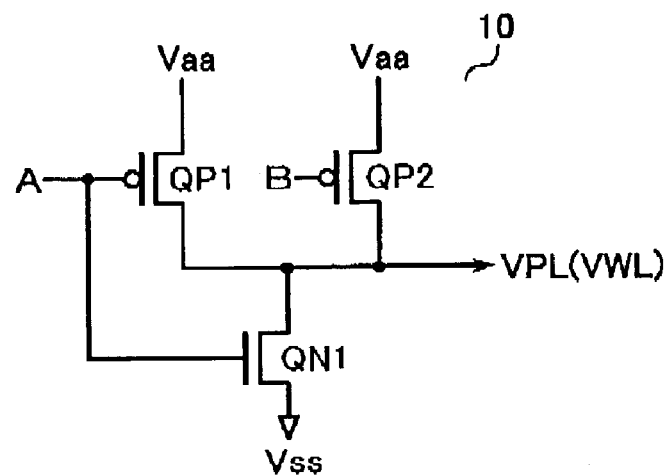
FIG. 5 is a diagram showing a configuration of a core drive circuit in accordance with another embodiment of the invention.

FIG. 5 shows a configuration of a core drive circuit 10 in accordance with another embodiment of the invention. This circuit is a modified version of the circuitry shown in FIG. 3 and is similar to the embodiment of FIG. 3 in relationship of PMOS transistors QP1–QP2 making up a pullup circuit. A pulldown circuit is configured from only a single NMOS transistor QN1, which is less in drivability than PMOS transistor QP2. Only the two timing signals A, B from the timing circuit 6 shown in FIG. 3 are used. The timing signal A is sent to enter the common-coupled gates of PMOS transistor QP1 and NMOS transistor QN1, whereas the timing signal B enters the gate of PMOS transistor QP2.

Figure 6:
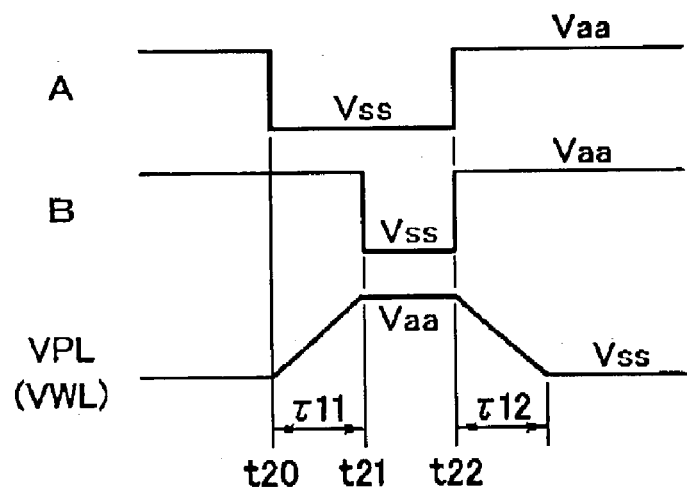
FIG. 6 is a diagram showing operation waveforms of the core drive circuit of FIG. 5.

FIG. 6 shows operation waveforms of this core drive circuit 10 relating to the case where a positive voltage waveform is output to the VPL terminal. When both the timing signals A–B are at high level, the PMOS translators QP1–QP2 turn off and the NMOS transistor QN1 turns on, with the VPL terminal staying at low level Vss. When timing signal A potentially goes low at time t20, NMOS transistor QN1 turns off and PMOS transistor QP1 turns on. As PMOS transistor QP1 is less in drivability, the VPL terminal potentially rises up slowly with a gently sloped or ramped ascent curve.

The timing circuit 6 operates to set the timing signal B at low level at time t21 with a specified time delay σ11. Thus the large-drivability PMOS transistor QP2 turns on, causing the VPL terminal to potentially go high to reach sufficiently high level Vaa. At a falling edge of an output voltage waveform, let the timing signals A and B be simultaneously set at high level at a time t22 with a predetermined time delay from the time t21, thereby causing PMOS transistors QP1–QP2 to turn off while forcing NMOS transistor QN1 to turn on. As NMOS transistor QN1 is less in drivability, VPL terminal potentially drops down slowly with a gently sloped discharge curve. This terminal finally returns to the sufficiently low level Vss before long, although there is no NMOS transistor used to accelerate discharging.

In the case of this embodiment, the drivability is changed in a two-step way on the pullup circuit side only, while using only a single drivability-lessened transistor in the pulldown circuit. Accordingly, the pulldown circuit is less in drivability so that this embodiment is less in low-level stability than the embodiment stated previously. However, it is possible to prevent data degradation of the ferroelectric capacitors of nonselected cells when designing the lengths of transition time periods σ11, σ12 at rising and falling edges of the VPL voltage waveform to substantially the same as the length of a time period in which the disturbance currents ip, -ip flow in the nonselect cell capacitors in a similar way to the embodiment stated supra.

Figure 7:
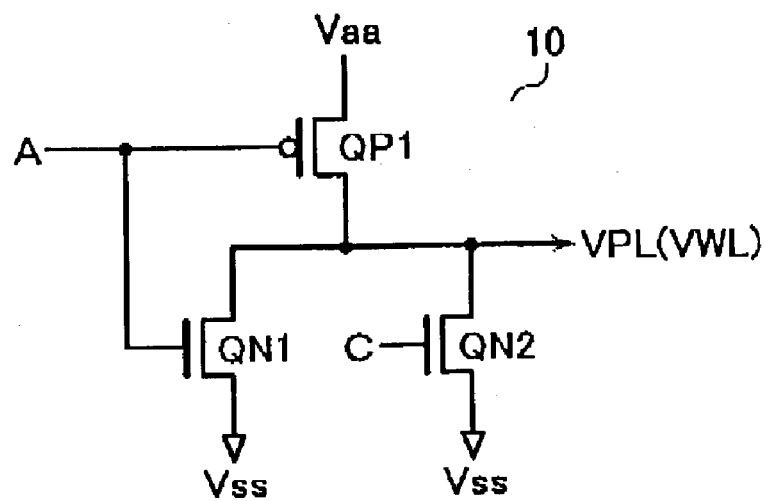
FIG. 7 is a diagram showing a configuration of a core drive circuit in accordance with still another embodiment of the invention.

A core drive circuit 10 in accordance with still another modification of the FIG. 3 circuit is shown in FIG. 7 in circuit diagram form. The circuit as shown herein is similar to the embodiment of FIG. 3 in relationship of the NMOS transistors QN1–QN2 making up a pullup circuit. A pullup circuit is made up of only one PMOS transistor QP1, which is less in drivability than the NMOS transistor QN2. Only two timing signals A and C incoming from the timing circuit 6 shown in FIG. 3 are used. The timing signal A is sent to enter the common-coupled gates of PMOS transistor QP1 and NMOS transistor QN1, whereas the timing signal C is input to the gate of NMOS transistor QN2.

Figure 8:
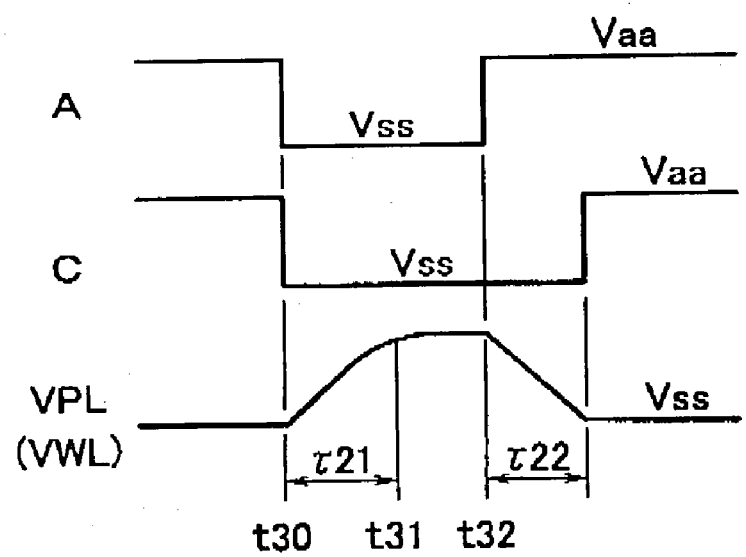
FIG. 8 is a diagram showing operation waveforms of the FIG. 7 circuit.

FIG. 8 shows operation waveforms of this core drive circuit 10 in case a positive voltage waveform is output to the VPL terminal. When both the timing signals A, C are at high level, the PMOS transistor QP1 turns off and the NMOS transistors QN1–QN2 turn on, with the VPL terminal staying at low level Vss. When timing signals A, C potentially goes low simultaneously at time t30, NMOS transistors QN1–2 turn off and PMOS transistor QP1 turns on. As PMOS transistor QP1 is less in drivability, VPL terminal potentially rises up slowly with a gently sloped or ramped ascent curve.

The timing circuit 6 waits for the elapse of a time σ21 until the potential level of VPL terminal becomes sufficiently higher and further waits for elapse of an appropriate time and thereafter sets the timing signal A at high level at time t31. Whereby, PMOS transistor QP1 turns off; simultaneously, NMOS transistor QN1 turns on. As NMOS transistor QN1 is less in drivability, VPL terminal behaves to potentially rise up slowly with a gently ramped discharge curve. Thereafter, when the timing signal C potentially goes high with a time delay σ22, NMOS transistor QN2 high in drivability turns on to thereby accelerate discharging, thus causing the VPL terminal to return at the sufficiently low level Vss.

In the case of this embodiment the drivability is switched in a two-step way on the pulldown circuit side only, while arranging the pullup circuit by use of only a single drivability-lessened transistor. Due to this, there is difficulty in obtaining a sufficiently high level output. However, it is possible to prevent data degradation or "corruption" of the ferroelectric capacitors of nonselected cells when designing the lengths of transition time periods σ21, σ22 at rising and falling edges of the VPL voltage waveform to substantially the same as the length of a time period in which the disturbance currents ip, -ip flow in the nonselect cell capacitors, as in the previous embodiments.

Although, in a respective one of the embodiments above, two transistors making up either the pullup circuit or the pulldown circuit are arranged so that these are different in drivability from each other while at the same time making them different in drive timing from each other, such parallel-provided two transistors may alternatively be made identical in drivability to each other. In this case also, making their drive timings different from each other enables achievement of two-step drivability switching operations. Thus, similar effects are expectable.

Figure 9:
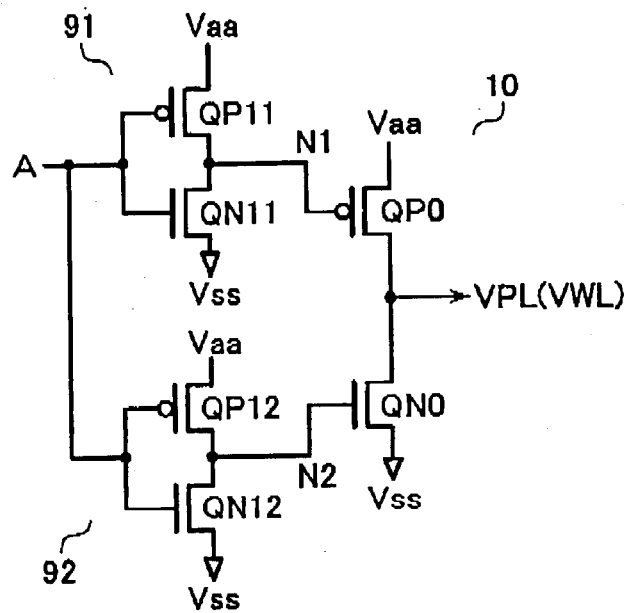
FIG. 9 is a diagram showing a configuration of a core drive circuit in accordance with yet another embodiment of the invention.

A core drive circuit 10 in accordance with a further embodiment of the invention is shown in FIG. 9. This embodiment is arranged to employ a single transistor to make up any one of the pullup and pulldown circuits. More specifically a PMOS transistor QP0 is used to constitute the pullup circuit; an NMOS transistor QN0 is used to form the pulldown circuit. Both of the transistors are high in drivability. Complementary MOS (CMOS) inverters 91, 92 are provided to drive these pullup PMOS transistor QP0 and pulldown NMOS transistor QN0 in a way responding to receipt of a timing signal "A". These CMOS inverters 91–92 make up a delay element which is operable to complementarily drive the gates of pullup PMOS transistor QP0 and pulldown NMOS transistor QN0 while letting them gradually vary in current drivabilities.

The pullup PMOS transistor QP0 and pulldown NMOS transistor QN0 are arranged so that they are substantially the same in drivability as each other. An example is that the channel width versus channel length ratio of pullup PMOS transistor QP0 is set equal to or two times greater than that of the pulldown NMOS transistor QN0. Additionally a PMOS transistor QP11 and NMOS transistor QN11 making up one CMOS inverter 91 are designed so that the channel width to channel length ratio of PMOS transistor QP11 is less than or equal to 1/100 of that of the pullup PMOS transistor QP0. Furthermore, the channel-width/channel-length ratio of NMOS transistor QN11 is less than or equal to 1/10 of that of the PMOS transistor QP11.

Regarding a PMOS transistor QP12 and NMOS transistor QN12 making up the other CMOS inverter 92, the channel-width/channel-length ratio of NMOS transistor QN12 is set so that it is less than or equal to 1/100 of that of pulldown NMOS transistor QN0. Additionally the channel-width/length ratio of PMOS transistor QP12 is less than or equal to 1/10 of that of the NMOS transistor QN12.

Figure 10:
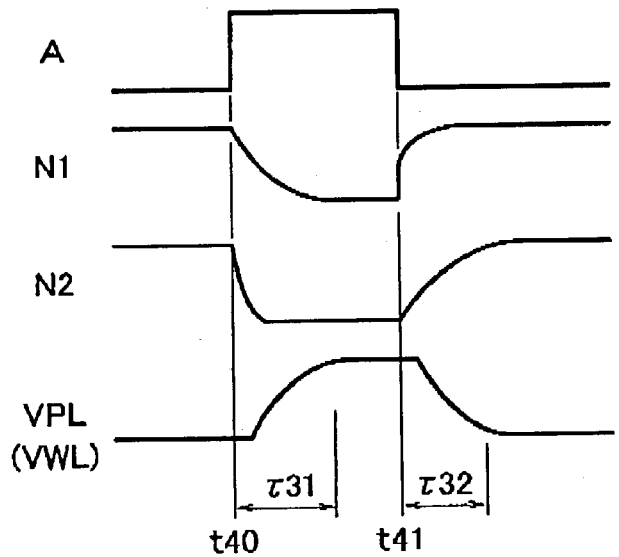
FIG. 10 is a diagram showing operation waveforms of the FIG. 9 circuit.

See FIG. 10, which shows operation waveforms of the core drive circuit 10 thus arranged. At a rising edge of timing signal A at time t40, an output node N1 which is connected to the gate of PMOS transistor QP0 of the inverter 91 gradually decreases in potential due to the fact that the turned-on NMOS transistor QN11 is less in discharging ability or dischargeability. On the other hand, an output node N2 that is coupled to the gate of the NMOS transistor QN0 of inverter 92 potentially decreases more rapidly. This is because the turned-on NMOS transistor QN12 is greater in dischargeability than NMOS transistor QN11.

Then, at this rising edge of the timing signal A, the pulldown NMOS transistor QN0 turns off while pullup PMOS transistor QP0 turns on. In this event, PMOS transistor QP0 is such that its gate voltage gradually decreases resulting in a gradual increase in current. Thus, VPL output voltage waveform exhibits a moderate or gently sloped ascent curve.

At a falling edge of the timing signal A at time t41, the output nods N2 gradually increases in potential because the turned-on PHOS transistor QP12 is less in charging ability or chargeability. On the contrary, the output node N1 potentially increases more rapidly as the turned-on PMOS transistor QP11 is greater in chargeability than PMOS transistor QP12.

At this falling edge of timing signal A, the pulldown NMOS transistor QN0 turns on while pullup PMOS transistor QP0 turns off. At this time NMOS transistor QN0 is such that its gate voltage gradually increases resulting in a gradual increase in current. Thus the VPL output voltage waveform exhibits a moderate or gently sloped fall-down curve.

Consequently, according to this embodiment also, it is possible to prevent data degradation at nonselected cells' ferroelectric capacitors by setting transition time σ31, σ32 of the riseup and falldown of the VPL voltage waveform to be almost the same as the time period in which disturbance currents ip, -ip flow in nonselected cell capacitors in a similar way to that of the previous embodiment. Also note that in the case of this embodiment, size relations on the p-channel side and n-channel side within the two CMOS inverters 91–92 are specifically set to ensure that the pullup PMOS transistor QP0 and pulldown NMOS transistor QN0 exhibit a gradual increase in turn-on current while permitting a turn-off operation to be done rapidly. Thus it is possible to dull the VPL terminal's waveform without having to flow any large shortcircuit currents or "shoot-through" currents in the pullup PMOS transistor QP0 and pulldown NMOS transistor QN0. Furthermore, unlike the embodiments of FIGS. 5 and 7, it is possible to obtain well stabilized high and low level outputs by designing both pullup PMOS transistor QP0 and pulldown NHOS transistor QN0 using those with large channel-width/channel-length ratios.

Figure 11:
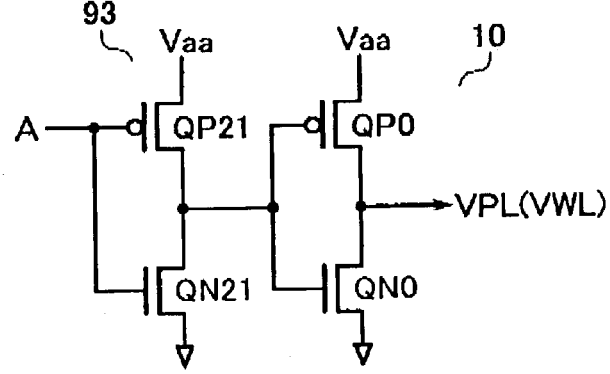
FIG. 11 is a diagram showing a configuration of a core drive circuit in accordance with a further embodiment of the invention.

FIG. 11 shows a core drive circuit 10 in accordance with another further embodiment of the invention, which is a modified version of the configuration shown in FIG. 9. In this embodiment the pullup PMOS transistor QP0 and pulldown NMOS transistor QN0 have their gates which are commonly coupled together to make up an output stage inverter. At a pre-stage in front of this output stage inverter, a CMOS inverter 93 is disposed which is much less in drivability than the output stage inverter and is for use as a delay element.

In this case also, the pullup PMOS transistor QP0 and pulldown NMOS transistor QN0 are substantially the same in drivability as each other. For example, the channel-width/channel-length ratio of pullup PMOS transistor QP0 is approximately equal to or two times greater than that of pulldown NMOS transistor QN0. In contrast, the channel-width/length ratio of the prestage inverter 93's PMOS transistor QP21 is less than or equal to 1/100 of that of pullup PMOS transistor QP0. Similarly the channel-width/length ratio of NMOS transistor QN21 is less than or equal to 1/100 of that of pulldown NMOS transistor QN0.

With this embodiment also, both the rising edge and the falling edge of an output voltage waveform obtainable at VPL terminal become moderate to have gently slopes or ramps, based on the same principle as that of the embodiment of FIG. 9. In the case of this embodiment, unlike the FIG. 9 embodiment, the pullup PMOS transistor QP0 and pulldown NMOS transistor QN0 are such that short-circuit currents or "shoot-through" currents increase in magnitude due to their current changes becoming moderate in both turn-on and turn-off events; however, similar effects are obtainable as to preclusion of data degradation at ferroelectric capacitors of nonselected cells.

Respective ones of the embodiments discussed above will be summarized as follows.

(1) Embodiment Shown in FIGS. 3 and 4

A pullup circuit as used herein is constituted from a first PMOS transistor and a second PMOS transistor which is provided in parallel thereto and is greater in driving ability or "drivability" than the first PMOS transistor, whereas a pulldown circuit used is made up of a first NMOS transistor having its gate which is commonly connected together to a gate of the first PMOS transistor and also having a second NMOS transistor which is connected in parallel to and greater in drivability than the first NMOS transistor.

In this case, a timing circuit is provided to generate, when setting an output terminal at a high potential level, a timing signal(s) for causing the first and second NMOS transistors to turn off while letting the first PMOS transistor turn on and thereafter allowing the second PMOS transistor to turn on with a delay of prespecified time duration. Alternatively, when setting the output terminal at a low level, the timing circuit generates a timing signal(s) for causing the first and second PMOS transistors to turn off while letting the first NMOS transistor turn on and thereafter turning the second NMOS transistor on with a delay of specified duration.

(2) Embodiment of FIGS. 5–6

A pullup circuit as used herein is configured from a first PMOS transistor and a second PMOS transistor which is provided in parallel thereto and is greater in drivability than the first PMOS transistor, whereas a pulldown circuit is made up of an NMOS transistor which has its gate commonly coupled to the gate of first PMOS transistor and which is less in drivability than the second PMOS transistor.

In this case a timing circuit is provided to cause, when setting the output terminal at high potential level, the NMOS transistor to turn off while letting the first PMOS transistor turn on and thereafter allows the second PMOS transistor to turn on with a delay of predetermined time duration. Alternatively, when setting the output terminal at low level, the timing circuit causes the first and second PMOS transistors to turn off while at the same time forcing the NMOS transistor to turn on.

(3) Embodiment of FIGS. 7–8

A pulldown circuit used herein is constituted from a first NMOS transistor and a second NMOS transistor which is provided in parallel thereto and is greater in drivability than the first NMOS transistor, while a pullup circuit is made up of a first NMOS transistor having its gate which is commonly coupled to the gate of first NMOS transistor and which is less in drivability than the second NMOS transistor.

In this case a timing circuit is provided to cause, when setting the output terminal at high potential level, the first and second NMOS transistors to turn off while turning the PMOS transistor on. When setting the output terminal at low level, the timing circuit drives the PMOS transistor to turn off while at the same time driving the first NMOS transistor to turn on and thereafter allows the second NMOS transistor to turn on with a delay of prespecified duration.

(4) Embodiment of FIGS. 9–10

A delay element is used which is designed for example to include first and second CMOS inverters. The first CMOS inverter is operatively responsive to receipt of a timing signal as input thereto, for driving the gate of a pullup PMOS transistor. The second CMOS inverter is responsive to an input timing signal for driving the gate of a pulldown NMOS transistor. In this case the first CMOS inverter is preferably configured from a first PMOS transistor having its channel-width to channel-length ratio which is less than or equal to 1/100 of that of the pullup PMOS transistor and a first NMOS transistor having its channel-width/channel-length ratio which is less than or equal to 1/10 of that of the first PMOS transistor. Similarly the second CMOS inverter is made up of a second NMOS transistor having its channel-width/channel-length ratio which is less than or equal to 1/100 of that of the pulldown NMOS transistor and a second PMOS transistor having its channel-width/channel-length ratio which is less than or equal to 1/10 of that of the second NMOS transistor.

(5) Embodiment of FIG. 11

The delay element may alternatively be configured from a CMOS inverter which is responsive to receipt of a timing signal as input thereto, for driving the common coupled gates of a pullup PMOS transistor and pulldown NMOS transistor. In this case the CMOS inverter is preferably designed to include a PMOS transistor having its channel-width/channel-length ratio which is less than or equal to 1/100 of that of the pullup PMOS transistor and an NMOS transistor having its channel-width/length ratio which is less than or equal to 1/100 of that of the pulldown NMOS transistor.

According to the embodiments set forth in the paragraphs (1) to (3), it is possible to make the waveform of a drive voltage dull by arranging at least one of the pullup and pulldown circuits making up a plateline or wordline drive circuit so that it is formed of two transistors different in drive timing from each other. With such an arrangement, it is possible to suppress or minimize the level of any possible transient voltage which is applied to the ferroelectric capacitor of a nonselected cell.

According to the embodiments of Paragraphs (4)–(5), even when a single pullup PMOS transistor and a single pulldown NMOS transistor are used to make up a plateline or wordline drive circuit, driving them via a delay element makes it possible to dull the drive voltage waveform. This in turn makes it possible to suppress or minimize the level of a transient voltage being applied to the ferroelectric capacitor of a nonselected cell.

While the present invention has been particularly shown and described with reference to the embodiments, it will be understood by those skilled in the art that various changes in form and in detail may be made without departing from the spirit, scope and teachings of the invention.

What is claimed is:

1. A ferroelectric memory device comprising:
    a memory cell array including a matrix layout of memory cells each having a transistor with its gate connected to a word line and a ferroelectric capacitor having one end connected to a bit line and a remaining and connected to a plate line;
    a plate-line drive circuit for driving said plate line;
    a word-line drive circuit for driving said word line; and
    a sense amplifier connected to said bit line for detecting and amplifying data of said memory cell, wherein
    at least one of said plate-line drive circuit and said word-line drive circuit has a pullup circuit for potentially raising an output terminal of this at least one from a low level up to a high level and a pulldown circuit for letting said output terminal potentially drop from the high level down to the low level, and
    at least one of said pullup circuit and said pulldown circuit is arranged to be variable in drivability during driving.

2. The ferroelectric memory device according to claim 1, wherein said memory cell array includes a cell block having a serial combination of a plurality of said memory cells each having a ferroelectric capacitor with its both ends connected to a source and a drain of said transistor, and wherein said cell block has one end connected to said bit line through a block select transistor and a remaining end connected to said plate line.

3. The ferroelectric memory device according to claim 2, wherein in said plurality of memory cells making up said cell block, the transistor of a memory cell being in a non-select state turns on whereas the transistor of a memory cell being selected turns off.

4. The ferroelectric memory device according to claim 1, wherein
    said pullup circuit has a first P-channel metal oxide semiconductor ("PMOS") transistor and a second PMOS transistor being provided in parallel thereto and being greater in drivability than said first PMOS transistor, and
    said pulldown circuit has a first N-channel metal oxide semiconductor ("NMOS") transistor with its gate commonly coupled to a gate of said first PMOS transistor and a second NMOS transistor being provided in parallel thereto and being greater in drivability than said first NMOS transistor.

5. The ferroelectric memory device according to claim 4, further comprising:
    a timing circuit for setting said output terminal at the high level by causing the first and second NMOS transistors to turn off and causing said first PMOS transistor to turn on and thereafter causing said second PMOS transistor to turn on with a prespecified time delay, said timing circuit being operable to set said output terminal at the low level by causing the first and second PMOS transistors to turn off and causing said first NMOS transistor to turn on and thereafter causing said second NMOS transistor to turn on with a specified time delay.

6. The ferroelectric memory device according to claim 1, wherein
    said pullup circuit has a first PMOS transistor and a second PMOS transistor being provided in parallel thereto and being greater in drivability than said first PMOS transistor, and
    said pulldown circuit has an NMOS transistor with its gate coupled together with a gate of said first PMOS transistor and being less in drivability than said second PMOS transistor.

7. The ferroelectric memory device according to claim 6, further comprising:
    a timing circuit for setting said output terminal at the high level by causing said NMOS transistor to turn off and causing said first PMOS transistor to turn on and thereafter allowing said second PMOS transistor to turn on with a prespecified time delay, said timing circuit being operable to set said output terminal at the low level by causing the first and second PMOS transistors to turn off and causing said NMOS transistor to turn on.

8. The ferroelectric memory device according to claim 1, wherein
    said pulldown circuit has a first NMOS transistor and a second NMOS transistor being provided in parallel thereto and being greater in drivability than said first NMOS transistor, and
    said pullup circuit has a PMOS transistor with its gate coupled together with a gate of said first NMOS transistor and being less in drivability than said second NMOS transistor.

9. The ferroelectric memory device according to claim 8, further comprising:
    a timing circuit for setting said output terminal at the high level by causing the first and second NMOS transistors to turn off and causing said PMOS transistor to turn on and for setting said output terminal at the low level by causing said PMOS transistor to turn off and causing said first NMOS transistor to turn on and thereafter allowing said second NMOS transistor to turn on with a predetermined time delay.

10. A ferroelectric memory device comprising:
a memory cell array including a matrix layout of memory cells each having a transistor with its gate connected to a word line and a ferroelectric capacitor having one end connected to a plate line and a remaining end connected via said transistor to a bit line;
a plate-line drive circuit for driving said plate line;
a word-line drive circuit for driving said word line;
a sense amplifier connected to said bit line for detecting and amplifying data of said memory cell; and
at least one of said plate-line drive circuit and said word-line drive circuit having a pullup PMOS transistor for potentially raising an output terminal from a low level up to a high level, a pulldown NMOS transistor for causing said output terminal to potentially drop from the high level down to the low level, and a delay element responsive to receipt of a timing signal for complementarily driving gates of said pullup PMOS transistor and said pulldown NMOS transistor while simultaneously letting these transistors vary in drivability.

11. The ferroelectric memory device according to claim 10, wherein said memory cell array includes a cell block having a serial combination of a plurality of said memory cells each having a ferroelectric capacitor with its both ends connected to a source and a drain of said transistor, and wherein said cell block has one end connected to said bit line through a block select transistor and a remaining end connected to said plate line.

12. The ferroelectric memory device according to claim 11, wherein in said plurality of memory cells making up said cell block, the transistor of a memory cell being in a non-select state turns on whereas the transistor of a memory cell being selected turns off.

13. The ferroelectric memory device according to claim 10, wherein said delay element has:
a first complementary MOS ("CMOS") inverter for receiving said timing signal as input thereto and for driving the gate of said pullup PMOS transistor; and
a second CMOS inverter for receiving said timing signal as input thereto and for driving the gate of said pulldown NMOS transistor.

14. The ferroelectric memory device according to claim 13, wherein
said first CMOS inverter has a first PMOS transistor with its channel width to channel length ratio being equal to or less than 1/100 of that of said pullup PMOS transistor and a first NMOS transistor with its channel width to channel length ratio being 1/10 or less than that of said first PMOS transistor, and
said second CMOS inverter has a second NMOS transistor with its channel width to channel length ratio being 1/100 or less than that of said pulldown NMOS transistor and a second PMOS transistor with its channel width to channel length ratio being 1/10 or less than that of said second NMOS transistor.

15. The ferroelectric memory device according to claim 10, wherein said delay element has a CMOS inverter for receiving said timing signal as input thereto and for driving the common gates of said pullup PMOS transistor and said pulldown NMOS transistor.

16. The ferroelectric memory device according to claim 15, wherein said CMOS inverter has a PMOS transistor with its channel width to channel length ratio being 1/100 or less than that of said pullup PMOS transistor and an NMOS transistor with its channel width to channel length ratio being 1/100 or less than that of said pulldown NMOS transistor.

17. A read control method of a ferroelectric memory device including a cell block formed of a series connection of plural memory cells each having a transistor with its gate connected to a word line and a ferroelectric capacitor having one end connected to a bit line and a remaining end connected to a plate line, each said memory cell being such that both ends of said ferroelectric capacitor are connected to a source and a drain of said transistor, and said cell block having one end connected to said bit line through a block select transistor and a remaining end connected to said plate line, said method comprising:
a first step of causing each transistor of said plural memory cells to turn on resulting in these memory cells being set in a non-select state while letting said cell block be electrically disconnected from said bit line;
a second step of driving, after said first step, said word line so that the transistor of a memory cell to be subjected to data readout in said plural memory cells turns off to thereby select this memory cell while simultaneously setting said bit line in an electrically floating state:
a third step of reading, after said second step, a signal voltage out of the selected memory cell onto said bit line by driving said plate line and also by turning said block select transistor on to thereby connect said cell block to said bit line; and
said third step including causing said plate line to vary in drivability during its driving.

18. The read control method of the ferroelectric memory device according to claim 17, wherein said second step includes causing said word line to vary in drivability during its driving as an alternative to causing said plate line to vary in drivability during its driving at said third step.

* * * * *